United States Patent [19]
Kim et al.

[11] Patent Number: 5,732,343
[45] Date of Patent: Mar. 24, 1998

[54] MICROWAVE HARMONIC MIXER CIRCUIT OF SUPER CONDUCTING QUANTUM INTERFERENCE DEVICE

[75] Inventors: Hong Teuk Kim; Byungdu Oh, both of Seoul, Rep. of Korea

[73] Assignee: LG Electronics Inc., Seoul, Rep. of Korea

[21] Appl. No.: 676,675

[22] Filed: Jul. 10, 1996

[30] Foreign Application Priority Data

Jul. 11, 1995 [KR] Rep. of Korea ............... 1995/20375

[51] Int. Cl.[6] ................................. H04B 1/26
[52] U.S. Cl. .................. 455/323; 455/318; 455/325; 327/355; 327/527; 505/202
[58] Field of Search ................... 455/317, 318, 455/319, 323, 325, 327, 330, 333; 327/113, 355, 527; 505/162, 190, 201, 202, 204, 210, 874

[56] References Cited

U.S. PATENT DOCUMENTS

| | | | |
|---|---|---|---|
| 5,280,649 | 1/1994 | Riebman | 455/330 |
| 5,469,057 | 11/1995 | Robinson | 327/527 |
| 5,530,927 | 6/1996 | Smith | 455/323 |

*Primary Examiner*—Reinhard J. Eisenzopf
*Assistant Examiner*—Thanh Le
*Attorney, Agent, or Firm*—John P. White

[57] ABSTRACT

Microwave harmonic mixer circuit of SQUID (Superconducting Quantum Interference Device) is disclosed, in which a magnetic flux to voltage conversion characteristics of SQUID is used for generating a higher harmonics from an LO(Local Oscillator) signal, and mixing the higher LO harmonics with a radio frequency(RF) signal, including an SQUID for adding a RF(Radio Frequency) signal to a magnetic flux of an LO(Local Oscillator) signal frequency for having a mixing of the frequencies done; a current applying part and a grounding part disposed on both sides of the SQUID and connected to a current source on one side and grounded on the other side respectively for supplying operation current to the SQUID; RF antenna parts one each disposed between the SQUID and the current applying part and the SQUID and the grounding part for feeding a RF signal into the SQUID; an LO signal source and antenna part for applying a flux of an LO signal frequency to the SQUID; and, an IF signal detecting part for detecting an IF(Intermediate Frequency) signal mixed in the SQUID, whereby a flux to voltage conversion characteristics of the SQUID of a superconducting junction is used in modulating the frequency and magnetic flux intensity of the LO signal for generating a dominant LO higher harmonics of very high order and mixing the higher harmonics with a high frequency RF signal in frequency base.

6 Claims, 5 Drawing Sheets

FIG.2A prior art  $V_{LO}(t)$
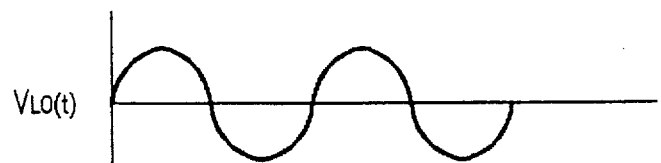
FIG.2B prior art  $\vartheta_1(t)$
FIG.2C prior art  $\vartheta_2(t)$
FIG.2D prior art  $\vartheta_1(t)+\vartheta_2(t)$

MICROWAVE HARMONIC MIXER CIRCUIT OF SUPER CONDUCTING QUANTUM INTERFERENCE DEVICE

BACKGROUND OF THE INVENTION

The present invention relates to a microwave harmonic mixer, more particularly to a microwave harmonic mixer circuit of SQUID(Superconducting Quantum Interference Device), in which a magnetic flux to voltage conversion characteristics of SQUID is used for generating a higher harmonics from an LO(Local Oscillator) signal, and mixing the higher harmonics with a radio frequency(RF) signal.

In general, the microwave harmonic mixer is frequently used in generating a higher harmonics which is a frequency component of the LO frequency multiplied by an integer, and mixing the higher harmonics with the RF signal, in case, though a high frequency LO signal is in need, an LO suitable to the high frequency band is not available.

Conventionally, in such a harmonic mixer, the higher harmonics component is generated from the current versus voltage non-linear characteristics of a diode, transistor, or superconducting junction device.

FIG. 1 illustrates a circuit showing such a conventional microwave harmonic mixer of diodes.

Referring to FIG. 1, a RF source $V_{RF}$ has a RF port impedance $R_1$ in series with a RF filter $F_{RF}$ connected thereto for keeping it isolated from other ports.

And, an LO source $V_{LO}$ has a port impedance $R_2$ in series with an LO filter $F_{LO}$ connected thereto for keeping it isolated from other ports.

Also, to a node to which the RF filter $F_{RF}$ and the LO filter $F_{LO}$ are connected, diodes D1 and D2 of the same characteristics are connected in parallel, but in opposite directions.

And, the diodes D1 and D2 are connected to an IF port which have impedance $R_3$ connected thereto through an intermediate frequency (IF) filter $F_{IF}$.

In this case, each of the RF, LO and IF impedances $R_1$, $R_2$ and $R_3$ has a resistor, and each of the RF, LO and IF filters $F_{RF}$, $F_{LO}$ and $F_{IF}$ are consisted of an inductance and a capacitance for keeping each port(RF, LO) isolated from the other ports.

Referring to FIG. 1 illustrating such a system, a RF signal from the RF source $V_{RF}$ is applied to the diodes D1 and D2 through the RF port impedance R1 and RF filter $F_{RF}$, and an LO signal from the LO source $V_{LO}$ is applied to the diodes D1 and D2 through the LO port impedance R2 and the LO filter $F_{LO}$.

In this case, as the diodes D1 and D2 are connected in parallel, but in opposite directions, the diodes D1 and D2 makes a full wave rectification as shown in FIGS. 2B–2D of an LO signal as shown in FIG. 2A which pumps the diodes D1 and D2, thereby a higher harmonics having two times frequency of the LO signal frequency can be effectively produced.

Accordingly, the low powered RF signal which passed the RF filter $F_{RF}$ is multiplied to the higher harmonics component of the LO in the diodes D1 and D2, having the frequency mix done, of which a required IF signal is filtrated through the IF filter $F_{IF}$ and inputs into the IF port impedance R3.

However, as the operative frequency goes higher, the system shown in FIG. 1 has problems, not only in that an LO source of which power and frequency stability are great can hardly secured, but also in that the frequency characteristics of the diode or transistor is getting worse.

Especially, in a millimeter band where most of RF signal is so weak to require a super low noise characteristic, a mixer of a superconducting junction operative up to a very high frequency and a low temperature can be dominantly used, still it has been a hard problem to secure an LO source suitable for the millimeter band.

SUMMARY OF THE INVENTION

The present invention is devised to solve aforementioned problems, and the object of the present invention is to provide a microwave harmonic mixer of SQUID, in which a magnetic flux to voltage conversion characteristics of SQUID of superconducting junction is used for modulating an frequency and magnetic flux intensity of an LO signal for generating a dominant LO harmonics of very high order, and mixing the LO harmonics with a high frequency RF signal.

The objects of the present invention can be achieved by providing a microwave harmonic mixer circuit of SQUID, including an SQUID for adding a RF(Radio Frequency) signal to a magnetic flux of an LO(Local Oscillator) signal for having a mixing of the frequencies done; a current applying part and a grounding part disposed on both sides of the SQUID and connected to a current source on one side and grounded on the other side respectively for supplying operation current to the SQUID; RF antenna parts one each disposed between the SQUID and the current applying part and the SQUID and the grounding part for feeding a RF signal into the SQUID; an LO signal source and antenna part for applying a flux of an LO signal frequency to the SQUID; and, an IF signal detecting part for detecting an IF(Intermediate Frequency) signal mixed in the SQUID.

BRIEF DESCRIPTION OF THE DRAWINGS

FIG. 2A–2D illustrate waveforms of the conductance of the mixer shown in FIG. 1.

DETAILED DESCRIPTION OF THE PREFERRED EMBODIMENTS

One preferred embodiment of the present invention will be explained in detail with reference to the attached drawings.

Figure 1:
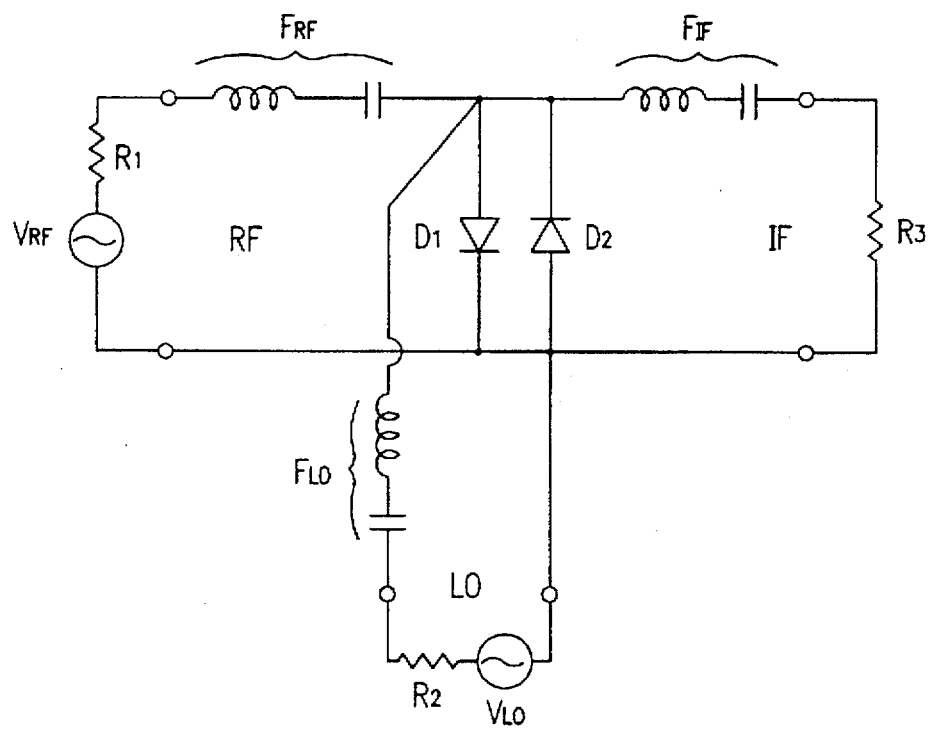
FIG. 1 illustrates a circuit showing a conventional microwave harmonic mixer.
Figure 3:
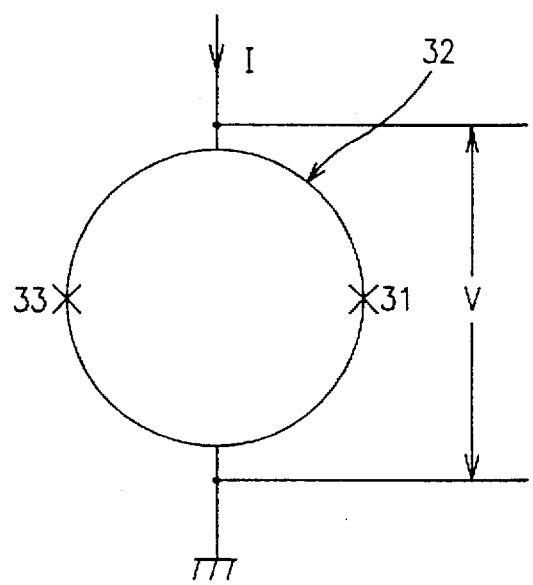
FIG. 3 illustrates a general superconducting quantum interference device(SQUID).

FIG. 3 illustrates a DC SQUID used for implementing the present invention.

Figure 4A:
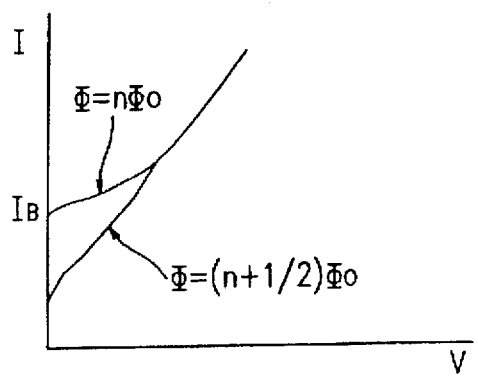
FIG. 4A illustrates a voltage vs. current(V-I) characteristics of the SQUID shown in FIG. 3.
Figure 4B:
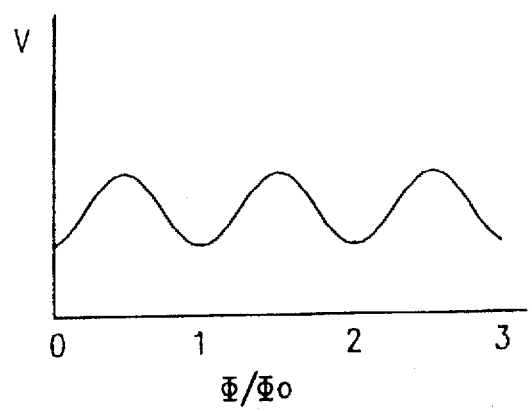
FIG. 4B illustrates a magnetic flux vs. voltage($\Phi$-V) characteristics at DC bias current of the SQUID shown in FIG. 3.
Figure 4C:
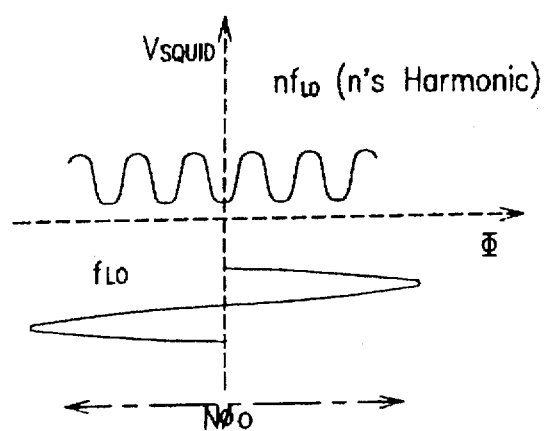
FIG. 4C illustrates a harmonic voltage characteristics by the LO magnetic flux modulation of the SQUID shown in FIG. 3.

The DC SQUID shown in FIG. 3 has a superconducting loop 32 containing two superconducting junctions 31 and And, as shown in FIG. 4A, the voltage vs. current(V-I) characteristics is varied depending on a magnetic flux passing through the loop 32 in the DC superconducting quantum interference device, and the magnetic flux vs. voltage($\Phi$-V) characteristics is varied as shown in FIGS. 4B and 4C.

Herein, in FIGS. 4A–4C, the $\Phi_0$, being one flux quantum, $\Phi_0 = h/2e = 2.07 \times 10^{-15}$ WB, the $\Phi$ represents a magnetic flux, and the n is an integer.

These characteristics represent that the voltage vs. current characteristics(V-I) is modulated, not only by the frequency, but also by the intensity of a magnetic signal upon application of great magnetic signal to the loop 32 in the DC superconducting quantum interference device.

Figure 5:
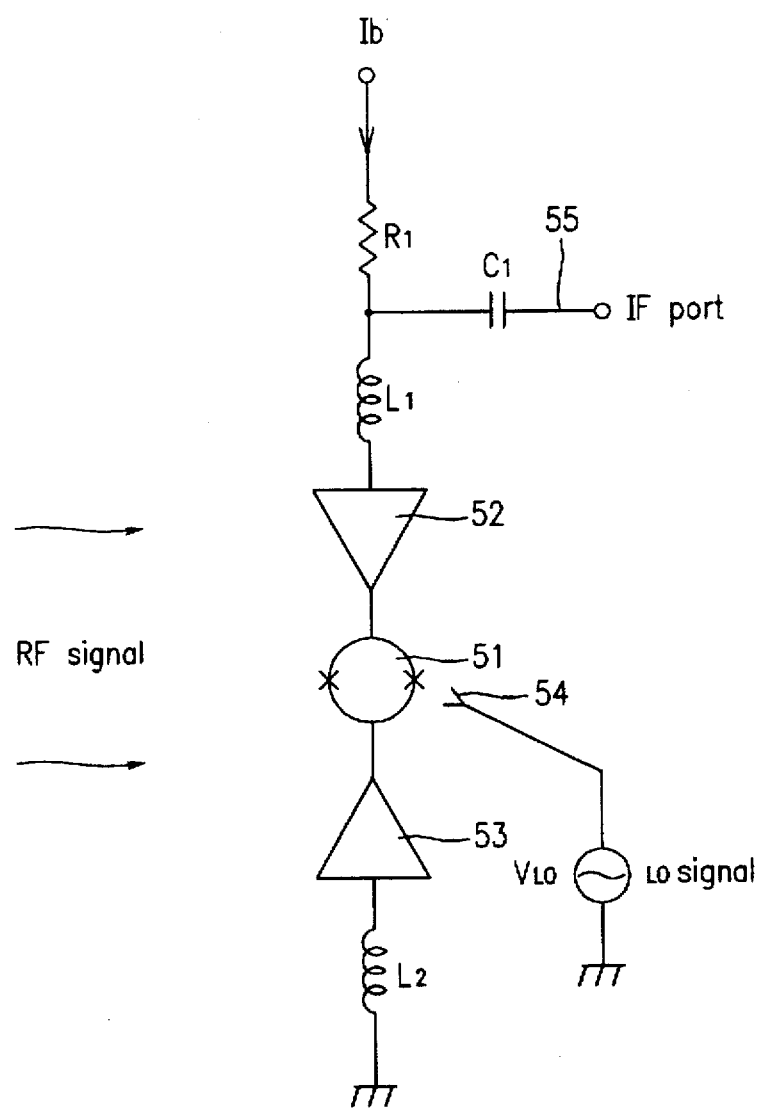
FIG. 5 illustrates a microwave harmonic mixer circuit of SQUID in accordance with the present invention.

FIG. 5 illustrates a microwave harmonic mixer circuit of SQUID in accordance with the present invention.

Referring to FIG. 5, output ports of the RF antennas 52 and 53 each of which supplies an RF signal into the SQUID 51 are connected at both sides of the SQUID 51 which applies the RF signal to a flux of an LO signal frequency for mixing the frequencies.

And, a current terminal Ib which supplies DC current to the RF antenna 52 through RF, LO choke L1 and resistor R1 is connected to an input terminal of the RF antenna 52, and an IF port 55 is connected in parallel between the RF, LO choke L1 and the resistor R1.

And, a RF, LO choke L2 is connected to an input terminal of the RF antenna 53, and the other side of the RF, LO choke L2 is grounded.

In the meantime, an LO signal source $V_{LO}$ for applying an LO signal to the SQUID 51 and an antenna 54 are provided on one side of the SQUID 51.

In one preferred embodiment of the present invention having aforementioned system, the DC current flows to ground through the resistor R1, RF, LO choke L1, RF antenna 52, SQUID 51, RF antenna 53, RF and LO choke L2 to supply the current to the SQUID 51.

In this instant, the LO signal generated in the LO signal source $V_{LO}$ provides a magnetic flux of LO signal frequency directly to the loop in the SQUID 51 through the LO antenna 54, without passing through the RF antennas 52 and 53.

Then, according to the magnetic flux vs. voltage conversion characteristics of the SQUID 51, a dominant several tens to several hundreds times LO harmonics is generated.

Accordingly, a higher harmonic current generated by the frequency and magnetic flux intensity of the LO signal flows in the SQUID 51, and of which component is mixed with a RF signal current entered through the RF antennas 52 and 53 according to the voltage vs. current(V-I) characteristics of the SQUID 51.

And, only a desired IF signal outputs from the IF port 55 through the RF, LO chokes L1 and L2 and the DC block capacitor C1.

In this case, the resistor R1 prevents the IF signal from flowing toward the DC current, the RF, LO chokes L1 and L2 prevent the RF, LO signal from leaking to outside of the SQUID 51, and the DC block capacitor C1 prevents the DC current from flowing toward the IF port 55.

And, the RF, LO chokes L1 and L2 and the block capacitor C1 become shorted at the IF signal frequency to provide a path for the IF signal.

Thus, by applying an LO signal of which signal power is great to a loop of the SQUID 51 as a flux, and adding a RF signal of which signal power is small to the LO higher harmonics component generated in the SQUID 51 due to the above, the mixer circuit of the present invention can have the mix of the frequencies done.

Further, as the mixer circuit is operative under a low temperature, a performance under a super low noise can be achieved.

Accordingly, the mixer circuit of the present invention is widely applicable to a microwave satellite telecommunication which requires a low noise and a high receptivity, especially, to a signal reception terminal in a millimeter band, effectively.

As has been explained, the microwave harmonic mixer circuit of SQUID in accordance with the present invention has advantages of facilitating generation of a dominant high order higher harmonics of an LO signal and mixing the higher harmonics to a high frequency RF signal by using a magnetic flux to voltage conversion characteristics of the SQUID of superconducting junction in modulating the frequency and magnetic flux intensity of the LO signal.

Although the invention has been described in conjunction with specific embodiments, it is evident that many alternatives and variations will be apparent to those skilled in the art in light of the foregoing description. Accordingly, the invention is intended to embrace all of the alternatives and variations that will fall within the spirit and scope of the appended claims.

What is claimed is:

1. A microwave harmonic mixer circuit of superconducting quantum interference device(SQUID) comprising:

an SQUID for adding a RF(Radio Frequency) signal to a magnetic flux of an LO(Local Oscillator) signal frequency for having a mixing of the frequencies done;

a current applying part and a grounding part disposed on both sides of the SQUID and connected to a current source on one side and grounded on the other side respectively for supplying operation current to the SQUID;

RF antenna parts one each disposed between the SQUID and the current applying part and the SQUID and the grounding part for feeding a RF signal into the SQUID;

an LO signal source and antenna part for applying a flux of an LO signal frequency to the SQUID; and, an IF signal detecting part for detecting an IF(Intermediate Frequency) signal mixed in the SQUID.

2. A microwave harmonic mixer circuit as claimed in claim 1, wherein the IF signal detecting part includes, an IF port connected to the current applying part, a choke, a capacitor and a resistor connected to the IF port in series/parallel, and a choke connected to the grounding part in series.

3. A microwave harmonic mixer circuit as claimed in claim 2, wherein the chokes prevent the RF signal and LO signal from leaking to outside of the SQUID.

4. A microwave harmonic mixer circuit as claimed in claim 2, wherein the capacitor prevents DC current from flowing toward the IF port.

5. A microwave harmonic mixer circuit as claimed in claim 2, wherein the resistor prevents the IF signal from flowing toward DC current.

6. A microwave harmonic mixer circuit as claimed in claim 2, wherein the chokes and the capacitor become shorted to provide a path for the IF signal.

* * * * *